United States Patent [19]
Coldren

[11] Patent Number: 4,896,325
[45] Date of Patent: Jan. 23, 1990

[54] MULTI-SECTION TUNABLE LASER WITH DIFFERING MULTI-ELEMENT MIRRORS

[75] Inventor: Larry A. Coldren, Santa Barbara, Calif.

[73] Assignee: The Regents of the University of California, Berkeley, Calif.

[21] Appl. No.: 235,307

[22] Filed: Aug. 23, 1988

[51] Int. Cl.[4] ................................................. H01S 3/10
[52] U.S. Cl. ........................................ 372/20; 372/99; 372/102; 372/38; 372/31; 372/29
[58] Field of Search .................... 372/101, 20, 92, 99, 372/102, 29, 32, 38

[56] References Cited

U.S. PATENT DOCUMENTS 4,358,851 11/1982 Scifres et al. ............................ 372/6
4,504,950 3/1985 Au Yeung ............................ 373/101

OTHER PUBLICATIONS

Akiba et al.; "Self-Focusing Lens as Resonator enables 10 GHz Modulation"; Fiberoptic Technology Oct. 1981, p. 124.

Primary Examiner—Leon Scott, Jr.
Attorney, Agent, or Firm—Donald A. Streck

[57] ABSTRACT

An improvement for allowing selective tuning of the emitted beam over a broad bandwidth to a diode laser having an active section for creating a light beam by spontaneous emission over a bandwidth around some center frequency and for guiding and reflecting the light beam between a pair of mirrors bounding the active on respective ends thereof to create an emitted beam of laser light. The mirrors each have narrow, spaced reflective maxima with the spacing of the reflective maxima of respective ones of the mirrors being different whereby only one the reflective maxima of each of the mirrors can be in correspondence and thereby provide a low loss window at any time. The preferred mirrors each include a plurality of discontinuities to cause the narrow, spaced reflective maxima wherein the spacing of the discontinuities of one mirror is different from the spacing of the discontinuities of the other mirror so as to cause the wavelength spacing of the maxima to be different. Additionally, the preferred embodiment includes a vernier circuit operably connected to the mirrors for providing an electrical signal to the mirrors which will cause continuous tuning within a desired frequency band, an offset control circuit operably connected to the mirrors for providing a voltage signal to the mirrors which will shift the reflective maxima of the mirrors into alignment at a desired frequency mode, and a phase control circuit for adjusting the laser mode wavelength to be in correspondence with the low loss window.

27 Claims, 3 Drawing Sheets

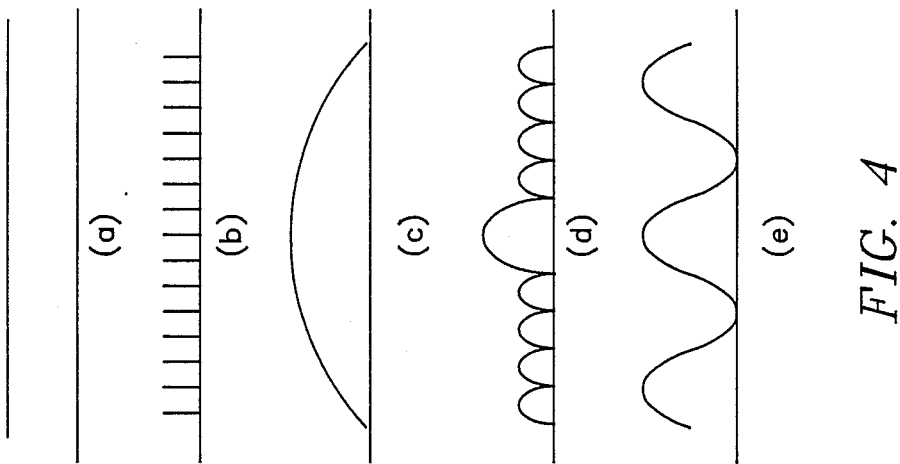
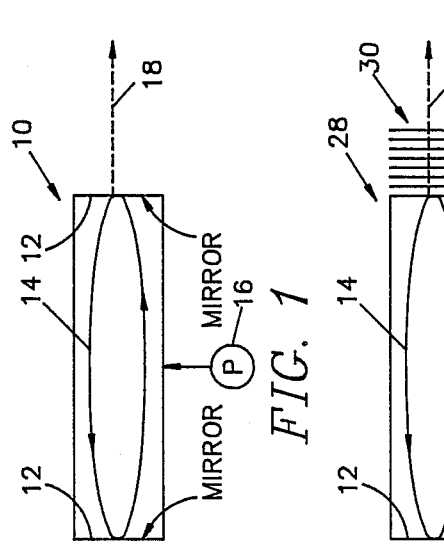
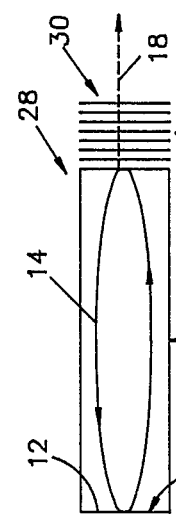
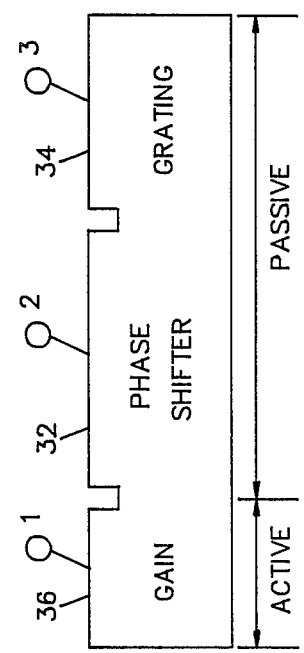

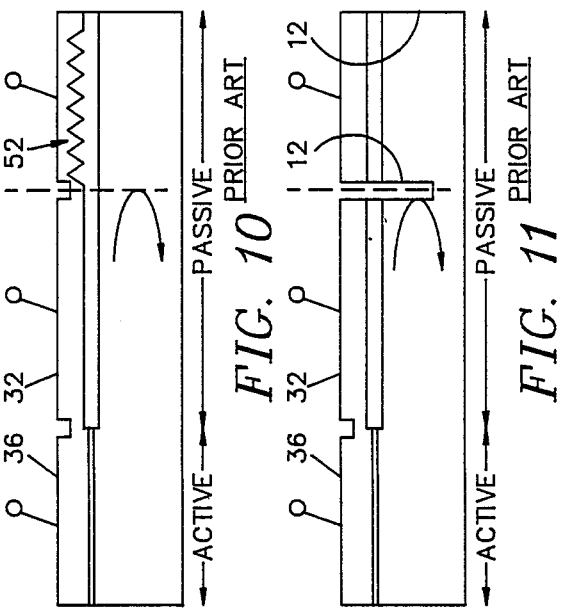
FIG. 10 PRIOR ART
FIG. 11 PRIOR ART
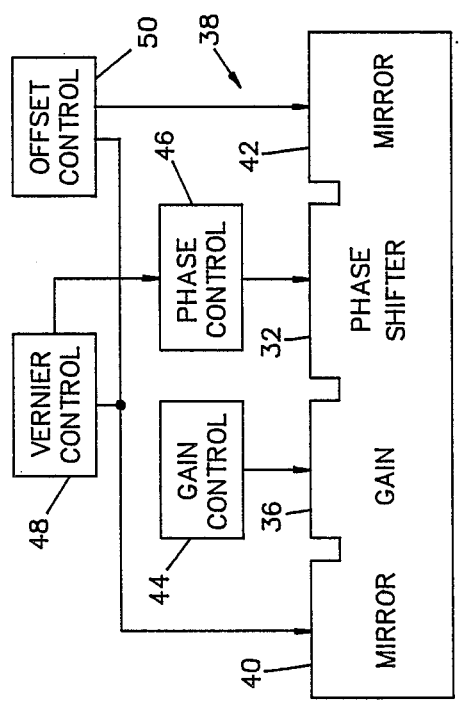
FIG. 8
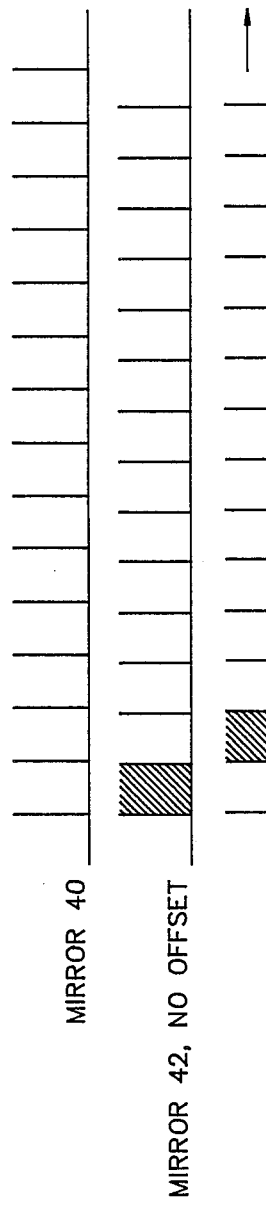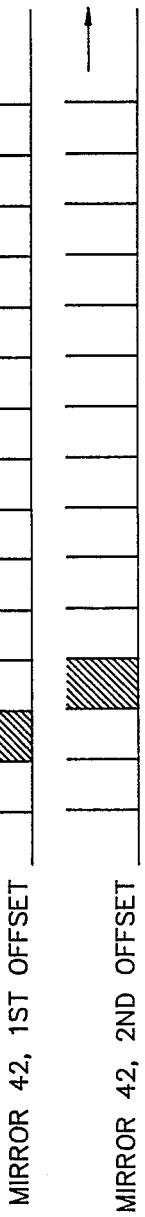
FIG. 9

MULTI-SECTION TUNABLE LASER WITH DIFFERING MULTI-ELEMENT MIRRORS

ORIGIN OF THE INVENTION

This invention was made with Government support under Grant No. DAAL03-86-G-0178 awarded by the U.S. Army Research Office. The Government has certain rights in this invention.

BACKGROUND OF THE INVENTION

This invention relates to semiconductor lasers and, more particularly, to configurations thereof that provide wavelength tunability. More specifically, the present invention is a diode laser which can be operated at selectably variable frequencies covering a wide wavelength range comprising, active section semiconductor means for creating a light beam by spontaneous emission over a bandwidth around some center frequency and for guiding the light beam between opposed ends thereof; gain control means operably connected to the active section semiconductor means for supplying a current to the active section semiconductor means which will cause the active section semiconductor means to provide gain to the lightbeam sufficient to overcome cavity losses to provide lasing and an emitted beam of laser light; a pair of mirrors bounding the active section semiconductor means on respective ones of the opposed ends thereof, the mirrors each having narrow, spaced reflective maxima with the spacing of the reflective maxima of respective ones of the mirrors being different whereby only one the reflective maxima of each of the mirrors can be in correspondence and thereby provide a low loss window at any time, the mirrors each including a plurality of discontinuities to cause the reflective maxima, the end spacing of the discontinuities of one mirror being different from that of the other mirror so as to cause the spacing of the reflective maxima to be different in respective ones of the mirrors; vernier control circuit means operably connected to the mirrors for providing a voltage signal to the mirrors which will cause continuous tuning of the low loss window within a desired frequency band; offset control circuit means operably connected to the mirrors for providing a voltage signal to the mirrors which will shift the reflective maxima of the mirrors into alignment at a desired frequency mode; phase shifter means for adjusting the round trip cavity phase and thus the lasing mode wavelength; and, phase control circuit means operated in synchronism with said vernier control circuit means for aligning the wavelength of the lasing mode to be the same as the low loss window.

Diode lasers are being used increasingly in such applications as optical communications and sensors. In such applications, a serious problem exists with respect to the lack of a diode laser which can be operated at selectably variable frequencies covering a wide wavelength range. Without such a laser, the number of independent "channels" that can occupy a given wavelength range is exceedingly small. Accordingly, the number of individual communications paths that can exist simultaneously is, likewise, much smaller than possible. Thus, while diode lasers provide solutions to many problems that have plagued communications, sensor, and computer system designs, they have not fulfilled early promises based on the available bandwidth. In order for optical communication to become viable for many future applications, such as local area networks, the number of channels must be increased.

For a variety of applications, it is necessary to have tunable single-frequency diode lasers which can select any of a wide range of wavelengths. Such applications include sources and local oscillators in coherent lightwave communications systems, sources for other multi-channel lightwave communication systems, and sources for use in frequency modulated sensor systems. Continuous tunability is usually needed over some range of wavelengths; but, for some applications, a combination of discrete wavelength jumps combined with a more limited range of continuous tunability is acceptable. The continuous tuning is important for wavelength locking or stabilization with respect to some other reference, and it is desirable in certain frequency shift keying modulation schemes. If continuous tuning over the entire range of interest were possible, it clearly would be preferred, however.

A typical diode laser is shown in FIG. 1 where it is generally indicated as 10. The laser 10 has a mirror 12 at each end. A light beam 14 is created and amplified within the laser 10 by the pumping current source 16 operably connected thereto. The light beam 14 is created by a process termed "spontaneous emission" over a bandwidth around some center frequency. Some of this light is captured by the dielectric waveguide formed by the active medium. The guided light is reflected by mirrors 12 that create a Fabry-Perot resonant cavity. The modes of this resonant cavity are spaced nearly equally in frequency according to $\Delta f = c/(2n_g l)$, where $n_g$ is the group index of the waveguide and $l$ is the mirror spacing. Simply put, these mode frequencies are those for which $l$ is an integer number of half wavelengths, or those at which the lightwave 14 adds constructively to itself after traversing the roundtrip of the cavity. Likewise, the mirrors 12 do not reflect 100% of the light striking them. As a consequence, there is some loss through the mirrors 12 at each reflection by the light beam 14. Also, there is propagation loss in the waveguide between the mirrors 12. As energy is added to the system by the current source 16, those frequency components of the light beam 14 which are in phase with the spacing of the mirrors 12 (i.e. Fabry-Perot modes) tend to be additive while those which are out of phase have components which tend to cancel out. The additive components continue to build in power until the laser "lases". That occurs at the current where the gain of the active medium equals the losses of the cavity waveguide and mirrors. Above this "threshold" current, the output laser light 18 from laser 10 increases rapidly in value.

FIGS. 4(a)–4(c) plot the mirror reflectivity, Fabry-Perot mode locations, and gain as a function of frequency for laser 10. FIG. 4(a) represents the reflectivity of the mirrors 12; that is, there is no substantial change in reflectivity over the gain bandwidth of the active medium. If one were to map or graph the corresponding loss of the laser 10, it would, of course, be the inverse of the graph of FIG. 4(a), having a flat loss. The Fabry-Perot modes of the laser light 18 can be depicted as shown in FIG. 4(b) for convenience, if desired. Without gain, all modes are equal. The overall gain of the laser 10 can be depicted as shown in simplified form in FIG. 4(c). At the maximum gain frequency, the gain minus loss reaches zero first as the gain level is increased by the current source 16, yielding an output 18 that contains a dominant mode near this frequency; however, the adjacent modes also have substantial gain. Thus, this is not a very good single frequency laser. The primary frequency of the laser 10 can be "tuned" only by changing the net optical cavity length as, for example, by adjusting the temperature thereof. This is certainly not an answer to the problem of providing a rapidly-tunable, single-frequency laser having selectable frequencies over a broad range.

As shown in FIG. 2, one can make a two part diode laser 28 by replacing one of the mirrors 12 with, for example, a grating 30, as depicted in FIG. 10. The overall reflectivity of such a mirror is shown in FIG. 4(d). The grating 30 provides a multiple reflective surface at the one end such that there are multiple spacings between the single mirror 12 and the multiple reflective surfaces of the grating 30. As can be seen from the figure, therefore, there is only one primary frequency band in the emitted laser light 18. This "Distributed Bragg-Reflector" (DBR) laser is good for single frequency emission; and, as is known to those skilled in the art, the two part diode laser 28 of FIG. 2 can be tuned to a small degree by electrically modifying the characteristics of the grating 30 (or other similarly operating device). A larger tuning is possible by using "jumps" to alternate modes. If, instead of using a grating the second mirror is composed of two discrete reflectors or an etalon, we get a multiple pass band mirror as shown in FIG. 4(e). The effective mirror on the right as the figure is viewed is then termed a "Fabry-Perot mirror". If the material with the Fabry-Perot mirror can be pumped to have gain, the configuration is generally referred to as a coupled-cavity laser. Tuning over several mode spacings is possible by tuning the currents to one or the other cavity by jumping from one mode to the other as with the grating two-section laser.

A substantial advancement in the art with respect to laser tunability was provided by the inventor herein by virtue of a three part laser as reported in an article in the IEEE Journal of Quantum Electronics, Vol. QE-23, No. 6, Jun. 1987 entitled "Continuously-Tunable Single-Frequency Semiconductor Lasers" by Larry A. Coldren and Scott W. Corzine (copy filed herewith). In that article, the present inventor, Dr. Coldren, and Mr. Corzine proposed a three section geometry, as depicted in FIG. 3, to provide "ideal" continuous tunability over a relative range of wavelengths $\Delta\lambda/\lambda \sim 0.5 \Delta n/n$, where $\Delta n$ is the maximum net index of refraction change that can be obtained in the passive sections of the laser, i.e. 32 and 34, respectively. The factor of $\sim 0.5$ in the above $\Delta\lambda/\lambda$ limit comes from the fact that the central phase shifter 32 must be modulated by about twice as much as the grating section 34 (which can be either a DBR grating reflector (FIG. 10) or a Fabry-Perot reflector (FIG. 11)) in order to line up a particular mode with the grating pass band since there is no tuning in the gain section 36. The gain section 36, phase shifter section 32, and grating section 34 are, of course, each "driven" by appropriate inputs at the inputs labelled "1", "2", and "3", respectively. If mode jumps are permitted, one can hope to gain back this factor of two. As is known in the art, the main limitation on tuning range is due to the limited net index change that can be obtained for a waveguide phase shifter. In forward biased carrier injection schemes, workers at NEC have been able to obtain an effective $\Delta n/n \sim 0.5\%$; but, free carrier loss is a major problem. In special reverse biased structures, the inventor herein and his workers have been able to obtain record levels of phase shift at low voltages $\sim 100°/Vmm$, with a maximum effective $\Delta n/n \sim 0.05\%$ at 5V; however, recent calculations by the same group indicate that relative index changes $\sim 5\%$ might be possible in very exotic quantum-wire structures. Index changes $\sim 1\%$ should be possible in less exotic quantum-well structures without undue loss. About half of these numbers might be available in a practical waveguided geometry. Thus, one tack that one might take in achieving a practical tunable laser adaptable for commercial applications would be to develop or find a very efficient phase shifter that might be integrated into a laser such as the prior art three section laser of FIG. 3.

With the more modest levels of phase shift available today, it was determined that it might be possible to cover a much wider wavelength range if discrete mode jumping could be combined in a practical way with continuous tuning. Many systems need a source that can emit wavelengths over a very wide range; but, it is not essential that the device tune smoothly from one point to another. It simply must get to the desired wavelength in a relatively short time. For packet switching kinds of applications, switching time $\sim 1$ ms may be quite tolerable; however, it is important that there be no ambiguity between the control signals to the device and the resulting wavelength.

Some time ago, it was felt in the art that any wavelength over the gain bandwidth of a laser could be selected by a properly designed two-section, coupled-cavity structure using the combined mode-jump/continuous-tuning philosophy. We now know that it is not possible to get sufficient spurious-mode suppression and unambiguously select a particular wavelength over the entire band. The three section device of FIG. 3 with a Fabry-Perot (FP) mode selection filter (FIG. 11) as the "grating" 30 is a slightly better candidate for combining mode-jump tuning with continuous tuning for broader wavelength coverage since it can continuously tune over several longitudinal mode spacings. As in the simple two section case, however, the mode selection filter has multiple reflection maxima as depicted in FIG. 4(e). Thus, it is theoretically conceivable that one maximum could be used for one wavelength tuning band and another maximum could be used for another wavelength tuning band, etc. As a practical matter, however, it is apparent that some provision must be made for unambiguously deciding which filter reflection maximum is to be used. Also, some provision must be made for improving the suppression of adjacent modes in a practical, positive, and efficient manner. There are also problems of theoretical operation versus actual operation that must be addressed in bringing a tunable laser to a practical commercial level. For example, one can talk about continuous tuning within one band and then jumping to the next adjacent band. In actual practice, however, operation tends to "stick" at a particular mode's primary frequency and then suddenly jump to the next mode's primary frequency rather than tuning smoothly within the band. Likewise, there is a practical limit on how much tuning can take place with prior art lasers such as the three section laser geometry of FIG. 3. As will be recalled, the relative change in mode wavelength which can be effected by the phase shifter 32 is limited to approximately one-half of the change which takes place in it. This is a physical limit which is currently $\sim 1\%$.

Wherefore, it is an object of the present invention to provide a tunable semiconductor laser which has a broad wavelength bandwidth in which it operates.

It is another object of the present invention to provide a tunable semiconductor laser which operates in a manner which makes it commercially practical.

It is still another object of the present invention to provide a tunable semiconductor laser which operates in a combined mode-jump/continuous-tuning manner and which smoothly tunes continuously within each band before making a jump to the next band.

It is yet a further object of the present invention to provide a control system for a tunable semiconductor laser operating in a combined mode-jump/continuous-tuning manner which simply, quickly, and accurately causes the laser to jump from band to band.

Other objects and benefits of the present invention will become apparent from the description which follows hereinafter when taken in conjunction with the drawing figures which accompany it.

SUMMARY

The foregoing objects have been achieved by the improved tunable diode laser of the present invention comprising, active section semiconductor means for creating a light beam by spontaneous emission over a bandwidth around some center frequency and for guiding the light beam between opposed ends thereof to create an emitted beam of laser light; a pair of mirrors bounding the active section semiconductor means on respective ones of the opposed ends thereof, the mirrors each having narrow, spaced reflective maxima with the spacing of the reflective maxima of respective ones of the mirrors being different whereby only one the reflective maxima of each of the mirrors can be in correspondence and thereby provide a low loss window at any time; and, a phase shifter to align the lasing mode with the low loss window.

In the preferred embodiment, the mirrors each include a plurality of discontinuities to cause the narrow, spaced reflective maxima, the spacing of the discontinuities of one mirror being different from the spacing of the discontinuities of the other mirror so as to cause the spacing of the reflective maxima to be different in respective ones of the mirrors.

Additionally in the preferred embodiment, there are vernier control circuit means operably connected to the mirrors for providing a voltage signal to the mirrors which will cause continuous tuning of the low loss window within a desired frequency band and offset control circuit means operably connected to the mirrors for providing a voltage signal to the mirrors which will shift the reflective maxima of the mirrors into alignment at a desired frequency mode.

Finally, in the preferred embodiment, there is a phase control circuit that adjusts the phase shifter to tune the mode continuously in alignment with the low loss mirror window over a desired wavelength band, presumably at least $(\lambda_2 - \lambda_1)$ wide.

It is also worthy of note that in the preferred embodiment of the present invention the phase shifter means, the two mirrors and the active section each have an electrode operably connected thereto for applying an electrical signal thereto and the index of refraction of the phase shifter means, the two mirrors and the active section are each changeable independently as a function of an electrical signal applied to the electrode thereof.

DESCRIPTION OF THE DRAWINGS

FIG. 1 is simplified drawing of a typical prior art two fixed mirror diode laser.

FIG. 2 is a simplified drawing of a typical prior art two section diode laser having one fixed mirror and one grating mirror.

FIG. 3 is a simplified drawing of a typical prior art three section diode laser having one fixed mirror and one grating mirror with the addition of a frequency shifting section.

FIG. 4 is a simplified drawing of various wave forms associated with the lasers of FIGS. 1 and 2.

FIG. 8 is a simplified drawing of the laser of FIG. 5 with the addition of the novel control circuitry of the present invention which allows the smooth frequency shifting thereof across an extended range.

FIG. 9 is a simplified drawing of the manner in which frequency shifting across an extended range is accomplished in the four section laser and associated control system of the present invention.

FIG. 10 is a schematic of a prior art three-section diode laser using a DBR grating reflector.

FIG. 11 is a schematic of a prior art three-section diode laser using a Fabry-Perot reflector.

DESCRIPTION OF THE PREFERRED EMBODIMENT

Figure 6:
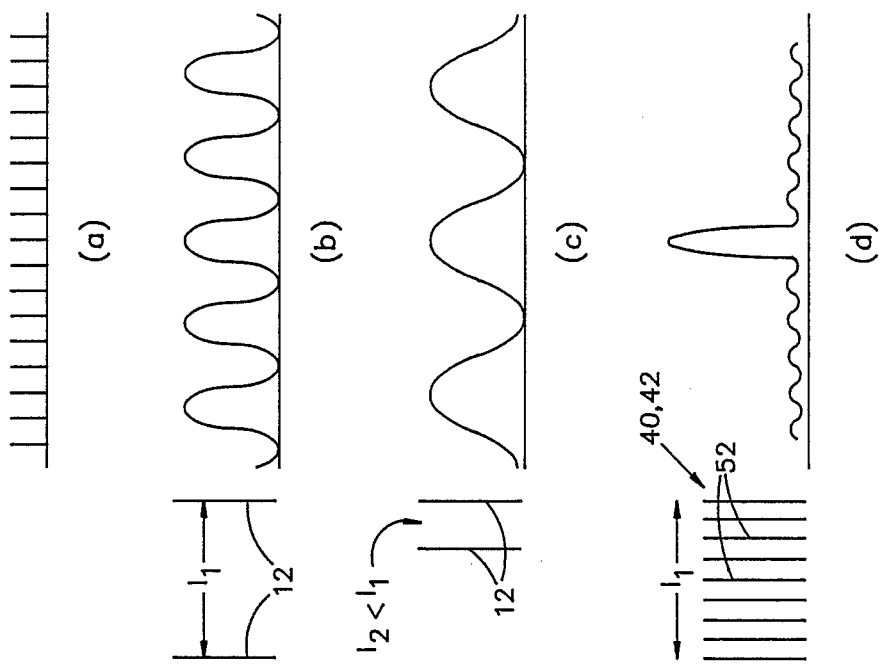
FIG. 6 is a simplified drawing of various wave forms associated with the lasers of FIGS. 1–3 and 5.
Figure 5:
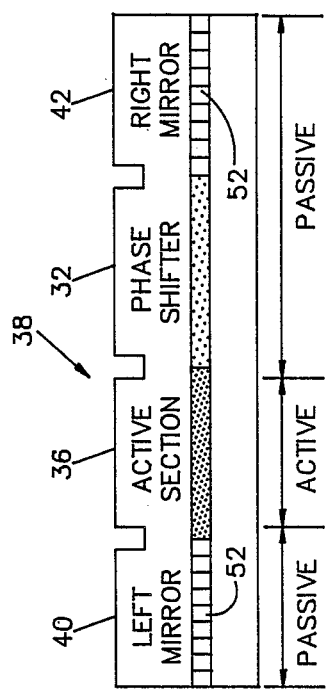
FIG. 5 is a simplified drawing of a four section frequency agile diode laser according to the present invention.

The novel four section tunable laser of the present invention is shown in simplified form in FIG. 5 where it is generally indicated as 38. By combining discrete mode-jump tuning with continuous tuning, it will be seen that this design allows the relative tuning range to be extended by at least an order of magnitude larger than $\Delta n/n$. To achieve the objectives, two multi-element mirrors 40, 42 are employed, one at each end of the laser 38. The gain section 36 and phase shifter section 32 are as described above with respect to the three-section laser of FIG. 3, of which this is an improvement. The mirrors 40, 42 are neither two-element etalons nor gratings, as described previously with respect to the prior art, as such devices either have a multiplicity of closely spaced band passes or only a single one, and, as such, are unsuitable for practical use in the particular environment and mode of operation employed to achieve the objectives of the present invention. Rather, the mirrors 40, 42 consist of an intermediate number of impedance discontinuities to provide a relatively narrow pass-band for mode selection together with a relatively widely spaced repeat mode feature that allows extended wavelength coverage. A comparison of prior art reflectivity characteristics to the reflectivity characteristics of the mirrors 40, 42 employed in the present invention can be seen in the simplified drawing representations of FIGS. 6 and 7. The mode wavelengths are depicted in FIG. 6(a) for comparison purposes. FIGS. 6(b) and 6(c) schematically illustrate the reflection properties of two element Fabry-Perot etalons, one long (e.g., $l_1 \sim 100\ \mu m$) and one short (e.g., $l_2 \sim 10\ \mu m$), adjacent to their respective reflection spectra. If these were used in a three-section Fabry-Perot configuration, the arrangement of FIG. 6(b) would give relatively good adjacent mode suppression, but a limited tuning range ($\Delta\lambda_a \sim 2$ nm) before the repeat mode at the adjacent Fabry-Perot mirror would appear. The arrangement of FIG. 6(c), on the other hand, would give a wide tuning range ($\Delta\lambda_b \sim 20$ nm) before the repeat mode moved to a higher place on the gain curve, but poor adjacent mode suppression would be observed. If a DBR grating is used as illustrated in FIG. 6(d), where a region corresponding to the longer Fabry-Perot etalon of FIG. 6(b) is filled with discontinuities 52 every half wavelength, there is essentially no repeat mode feature, i.e. there is only one net wavelength of low cavity loss. Actually, the grating's harmonics represent the additional mirror maxima in this case, but they are out of the picture. Assuming the grating reflection does not approach unity, the width of its reflection maximum would be similar to that of a Fabry-Perot of equal length.

Figure 7:
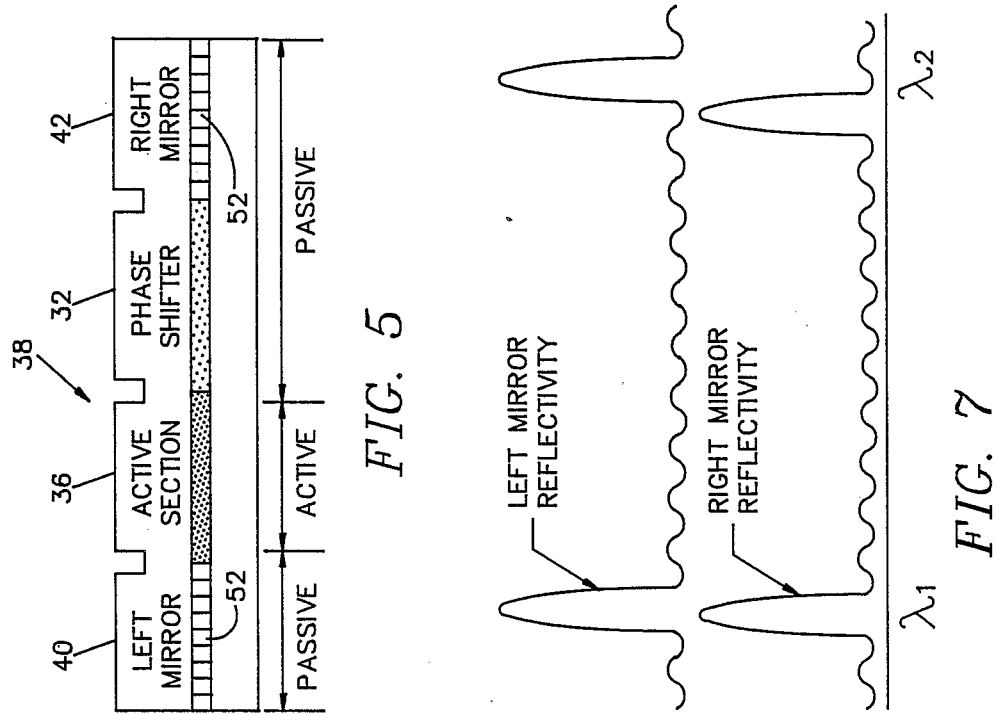
FIG. 7 is a simplified drawing of the wave forms associated with the two different mirrors employed in the laser of FIG. 5.

In the present invention, the mirrors 40, 42 are implemented with only a few discontinuities, for example, ten and nine or nine and eight discontinuities, respectively. By way of example, if one were to use ten and nine ($N_L = 10 \& N_R = 9$), the left and right mirrors 40, 42 will have maxima (low losses) spaced by $\lambda_b$ and $0.9\lambda_b$, respectively. The net effect is a low loss cavity only every $9\lambda_b$, where both mirrors again have simultaneous maxima. By using two slightly different mirror designs (i.e. the mirrors 40, 42 contain a different number of discontinuities 52) as the mirrors 40, 42, respectively, at the two laser ends, the repeat spacing between reflective maxima of each is different, as depicted in FIG. 7. This is an important aspect relative to the operability of the present invention and its ability to attain its stated objectives. Under the conditions shown in FIG. 7, the reflective maxima (and, therefore, the corresponding loss minima) of the mirrors 40, 42 at frequency $\lambda1$ correspond and, therefore, there is a net low loss window at that frequency. The next two maxima (on the right as the figure is viewed) are at different frequencies and, therefore, there is no net low loss window at $\lambda2$. On the other hand, if the characteristics of the laser 38 is changed to place the maxima of the two mirrors 40, 42 in synchronization at $\lambda2$, there will now be a net low loss window at $\lambda2$ and no window at $\lambda1$. As should be appreciated by those skilled in the art at this point, this shift is accomplished with only the slight shift required to shift the two maxima of the two different (i.e. left and right) mirrors 40, 42 into alignment, not that required to move from one maxima to the next in a single mirror as in the prior art—which caused the prior art to have such a limited range of tunability. It is desirable that the achievable $\Delta n/n$ will allow continuous tuning over the $\lambda_b$ spacing between individual maxima. Thus, in the foregoing example, tuning of the low loss mirror window over a range of up to $9\lambda_b \sim 9\Delta n/n$ is possible by alternately 1) tuning both mirrors 40, 42 together over the available $\Delta n/n$ range ($\lambda_b$), then 2) returning to the initial condition, but with one mirror's maxima shifted by $\lambda_a = 0.1\lambda_b$ so that the next pair of maxima line up where we left off, etc. For continuous mode tuning over $\lambda_b$, the phase shifter is adjusted in synchronism with the mirrors in step 1.

This method of operation, along with the novel control system of the present invention employed to accomplish it, is shown in FIGS. 8 and 9. As shown in FIG. 8, the laser 38 has the gain section 36 thereof operably controlled by gain control circuitry 44. Similarly, the phase shifter section 32 is operably controlled by phase control circuitry 46. The two mirrors 40, 42 are simultaneously controlled in the manner described above by vernier control circuitry 48 and offset control circuitry 50. The vernier control circuity 48 provides a voltage signal to the mirrors 40, 42 ($V_{control}$) which causes the continuous tuning desired within a particular band while the offset control circuitry 50 provides a voltage signal to the mirrors 40, 42 ($V_{input}$) which shifts the reflective maxima of the mirrors 40, 42 into alignment at a particular mode in the manner described above with respect to FIG. 7.

The phase control circuitry is controlled in proportion to the vernier signal. This can be appreciated best with reference to the diagram of FIG. 9. The left mirror 40 has characteristics which correspond to the upper line in FIG. 7 while right mirror 42's characteristics correspond to the lower line in the same figure; that is, the distance between reflective maxima in mirror 42 is slightly less than the distance in mirror 40. In the initial state, there is no offset added by the offset control circuity 50 (i.e. $V_{input} = 0$). By adjusting $V_{control}$ between 0 and some $V_{max}$, the vernier control circuitry 48 can tune the laser 38 within the crosshatched area indicated in the figure for no offset. Upon reaching $V_{max}$, a first offset is applied by the offset control circuitry 50 and $V_{input}$ is once again restarted at 0. This causes the tuning to jump to the next maxima point and by again adjusting $V_{control}$ between 0 and $V_{max}$, the vernier control circuitry 48 can tune the laser 38 within the cross-hatched area indicated in the figure for a first offset. The same procedure is followed for a second offset, et seq., through the tunable band of the laser 38. As can be appreciated, this greatly extends the tunable bandwidth of the laser 38 as compared with the prior art approaches discussed above.

Thus, it can be seen from the foregoing description that the present invention has truly met its stated objectives by providing a diode laser which is agile in the selective tuning capable over an extended wavelength.

Wherefore, having thus described the present invention, what is claimed is:

1. In a diode laser having an active section for creating a light beam by spontaneous emission over a bandwidth around some center frequency and for guiding and reflecting the light beam between a pair of mirrors bounding the active section on respective ends thereof to create an emitted beam of laser light, the improvement to allow selective tuning of the emitted beam comprising:

the mirrors each having spaced reflective maxima points providing a maximum reflection of an associated wavelength with the spacing of said reflective maxima points of the respective mirrors being different whereby only one said reflective maxima of each of the mirrors can be in correspondence with a wavelength of the created lightbeam and thereby provide a low loss window at any time.

2. The improvement to a diode laser of claim 1 and additionally comprising:

mirror means for adjusting a wavelength at which said reflective maxima points of the respective mirrors occur whereby the wavelength of said low loss window and therefore the frequency of the emitted beam can be adjusted.

3. The improvement to a diode laser of claim 2 and additionally comprising:

phase shifter means for adjusting the round trip cavity phase between the pair of mirrors and thus a lasing mode wavelength of the diode laser.

4. The improvement to a diode laser of claim 3 and additionally comprising:
means for adjusting said phase shifter means in combination with said means for adjusting the wavelength at which said reflective maxima points of the respective mirrors occurs whereby the wavelength of said low loss window and the lasing mode wavelength of the diode laser can be adjusted in synchronism to provide selective tuning over a broad bandwidth.

5. The improvement to a diode laser of claim 3 wherein:
an index of refraction of said phase shifter means, the two mirrors and an active section are each changeable independently as a function of an electrical signal applied thereto.

6. The improvement to a diode laser of claim 3 wherein:
(a) said phase shifter means, the two mirrors and an active section each have an electrode connected thereto for applying an electrical signal thereto; and,
(b) the index of refraction of said phase shifter means, the two mirrors and the active section are each changeable independently as a function of said electrical signal applied to said electrode thereof.

7. The improvement to a diode laser of claim 1 wherein:
the mirrors each include a plurality of discontinuities which cause said reflective maxima points, the spacing of said discontinuities of one mirror being different from the spacing of said discontinuities of the other mirror so as to cause a wavelength spacing of said reflective maxima points to be different in respective ones of the mirrors.

8. The improvement to a diode laser of claim 7 and additionally comprising:
mirror means for adjusting an optical spacing of said discontinuities of the respective mirrors whereby the wavelength of said low loss window and therefore the frequency of the emitted beam can be adjusted.

9. The improvement to a diode laser of claim 8 wherein said means for adjusting the optical spacing of said discontinuities comprises:
(a) vernier control circuit means connected to the mirrors for providing an electrical signal to the mirrors which causes continuous tuning within a desired frequency band; and,
(b) offset control circuit means connected to the mirrors for providing a electrical signal to the mirrors which shifts said reflective maxima points of the mirrors into alignment at a desired frequency mode.

10. The improvement to a diode laser of claim 9 and additionally comprising:
(a) phase shifter means for adjusting the round trip cavity phase between the pair of mirrors and thus a lasing mode wavelength of the diode laser; and,
(b) phase control circuit means operated in synchronism with said vernier control circuit means for aligning the wavelength of the lasing mode wavelength of the diode laser to be the same as the wavelength of said low loss window.

11. An improved tunable diode laser comprising:

(a) active section semiconductor means for creating a light beam by spontaneous emission over a bandwidth around some center frequency and for guiding said light beam between opposed ends thereof to create an emitted beam of laser light; and,
(b) a pair of mirrors bounding said active section semiconductor means on respective ones of said opposed ends thereof, said mirrors each having spaced reflective maxima points providing a maximum reflection of an associated wavelength with the spacing of said reflective maxima points of respective ones of said mirrors being different whereby only one said reflective maxima of each of said mirrors can be in correspondence with a wavelength of the created lightbeam and thereby provide a low loss window at any time.

12. The improved tunable diode laser of claim 11 and additionally comprising:
mirror means for adjusting a wavelength at which said reflective maxima points of respective ones of said mirrors occurs whereby the wavelength of said low loss window and therefore the frequency of said emitted beam can be adjusted.

13. The improved tunable diode laser of claim 12 and additionally comprising:
phase shifter means for adjusting the round trip cavity phase between said mirrors and thus a lasing mode wavelength of the diode laser.

14. The improved tunable diode laser of claim 13 and additionally comprising:
means operably connected for adjusting said phase shifter means in combination with said means for adjusting the wavelength at which said reflective maxima of respective ones of said mirrors occurs whereby the wavelength of said low loss window and the lasing mode wavelength of the diode laser can be adjusted in synchronism to provide selective tuning over a broad bandwidth.

15. The improved tunable diode laser of claim 13 wherein:
an index of refraction of said phase shifter means, said mirrors and said active section semiconductor means are each changeable independently as a function of an electrical signal applied thereto.

16. The improved tunable diode laser of claim 13 wherein:
(a) said phase shifter means, said mirrors and said active section semiconductor means each have an electrode connected thereto for applying an electrical signal thereto; and,
(b) the index of refraction of said phase shifter means, said mirrors and said active section semiconductor means are each changeable independently as a function of said electrical signal applied to said electrode thereof.

17. The improved tunable diode laser of claim 11 wherein:
said mirrors each include a plurality of discontinuities causing said reflective maxima points, the spacing of said discontinuities of one said mirror being different from the spacing of said discontinuities of the other said mirror so as to cause the wavelength spacing of said reflective maxima points to be different in respective ones of said mirrors.

18. The improved tunable diode laser of claim 17 and additionally comprising:
means for adjusting an optical spacing of said discontinuities of respective ones of said mirrors occurs whereby the wavelength of said low loss window and therefore the frequency of said emitted beam can be adjusted.

19. The improved tunable diode laser of claim 18 wherein said means for adjusting an optical spacing of said discontinuities comprises:
(a) vernier control circuit means connected to said mirrors for providing an electrical signal to said mirrors which causes continuous tuning within a desired frequency band; and,
(b) offset control circuit means operably connected to said mirrors for providing a electrical signal to said mirrors which shifts said reflective maxima of said mirrors into alignment at a desired frequency mode.

20. The improved tunable diode laser of claim 19 and additionally comprising:
(a) phase shifter means for adjusting the round trip cavity phase between said mirrors and thus a lasing mode wavelength of the diode laser; and,
(b) phase control circuit means operated in synchronism with said vernier control circuit means for aligning the wavelength of the lasing mode wavelength of the diode laser to be the same as the wavelength of said low loss window.

21. A diode laser which can be operated at selectably variable frequencies covering a wide wavelength range comprising:
(a) active section semiconductor means for creating a light beam by spontaneous emission over a bandwidth around some center frequency and for guiding said light beam between opposed ends thereof;
(b) gain control means connected to said active section semiconductor means for supplying an electrical signal to said active section semiconductor means which causes said active section semiconductor means to have gain sufficient to overcome losses and create an emitted beam of laser light;
(c) a pair of mirrors bounding said active section semiconductor means on respective ones of said opposed ends thereof, said mirrors each having spaced reflective maxima points providing a maximum reflection of an associated wavelength with the spacing of said reflective maxima points of respective ones of said mirrors being different whereby only one said reflective maxima of each of said mirrors can be in correspondence with a wavelength of the created lightbeam and thereby provide a low loss window at any time, said mirrors each including a plurality of discontinuities to cause said reflective maxima, the spacing of said discontinuities of one said mirror being different from the spacing of said discontinuities of the other said mirror so as to cause the spacing of said reflective maxima to be different in respective ones of said mirrors; and,
(d) means operably connected to said mirrors for independently adjusting an index of refraction of said phase shifter means, said mirrors and said active section semiconductor means.

22. The diode laser of claim 21 wherein said adjusting means comprises:
(a) said phase shifter means, said mirrors and said active section semiconductor means each have an electrode connected thereto for applying an electrical signal thereto; and,
(b) means for applying independent electrical signals to respective ones of said electrodes thereby causing an index of refraction of said phase shifter means, said mirrors and said active section semiconductor means to be changed independently as a function of said electrical signal applied to said electrode thereof.

23. The diode laser of claim 21 wherein said adjusting means includes:
(a) vernier control circuit means operably connected to said mirrors for providing a voltage signal to said mirrors which causes continuous tuning within a desired frequency band; and,
(b) offset control circuit means connected to said mirrors for providing a voltage signal to said mirrors which shifts said reflective maxima of said mirrors into alignment at a desired frequency mode.

24. The diode laser of claim 23 and additionally comprising:
(a) phase shifter semiconductor means disposed between said active section semiconductor means and one of said mirrors for adjusting the round trip cavity phase between said mirrors and thus a lasing mode wavelength of the diode laser; and,
(b) phase control circuit means operated in synchronism with said vernier control circuit means for aligning the wavelength of the lasing mode wavelength of the diode laser to be the same as the wavelength of said low loss window.

25. The improvement to a diode laser of claim 23 and additionally comprising:
phase shifter means for adjusting the round trip cavity phase between the pair of mirrors and thus a lasing mode wavelength of the diode laser.

26. In a diode laser having,
active section semiconductor means for creating a light beam by spontaneous emission over a bandwidth around some center frequency and for guiding the light beam between opposed ends thereof;
gain control means connected to the active section semiconductor means semiconductor means for supplying an electrical signal to the active section semiconductor means semiconductor means which will cause the active section semiconductor means semiconductor means to provide gain to overcome losses and create an emitted beam of laser light;
a pair of mirrors bounding the active section semiconductor means semiconductor means on respective ones of the opposed ends thereof, the mirrors each having spaced reflective maxima points providing a maximum reflection of an associated wavelength with the spacing of the reflective maxima points of respective ones of the mirrors being different whereby only one the reflective maxima points of each of the mirrors can be in correspondence with a wavelength of the created lightbeam and thereby provide a low loss window at any time, the mirrors each including a plurality of discontinuities causing the reflective maxima points, the spacing of the discontinuities of one mirror being different from the spacing of the discontinuities of the other mirror so as to cause a wavelength spacing of the reflective maxima points to be different in respective ones of the mirrors; and,
phase shifter semiconductor means disposed between the active section semiconductor means and one of the mirrors for adjusting the round trip cavity phase between the mirrors and thus a lasing mode wavelength of the diode laser, the method of operation at selectably variable frequencies covering a wide wavelength range comprising the steps of:
  (a) connecting vernier control circuit means to the mirrors to provide a selectably adjustable electrical signal to the mirrors which can cause continuous tuning within a frequency band;
  (b) connecting offset control circuit means to the mirrors to provide an electrical signal to the mirrors which can shift the reflective maxima of the mirrors into alignment at a desired frequency mode;
  (c) connecting phase control circuit means to the phase shifter semiconductor means to adjust the round trip cavity phase between the mirrors;
  (d) using the offset control circuit means to shift the reflective maxima of the mirrors into alignment at a desired frequency mode;
  (e) using the vernier control circuit means to tune the laser within a frequency band adjacent the frequency mode selected by the offset control circuit means; and,
  (f) using the phase control circuit means in synchronism with the vernier control circuit means to align the wavelength of the lasing mode wavelength of the diode laser to be the same as the wavelength of said low loss window.

27. The method of claim 26 wherein said step (e) of using the phase control circuit means in synchronism with the vernier control circuit means comprises the steps of:
  (a) connecting an output from the vernier control circuit means to the phase control circuit means; and,
  (b) using a signal output from the vernier control circuit means to control the phase control circuit means.

* * * * *